(12) United States Patent
Matsubara

(10) Patent No.: US 6,317,063 B1
(45) Date of Patent: Nov. 13, 2001

(54) INVERSE QUANTIZATION USING TABLE WITH REDUCED SIZE

(75) Inventor: Katsushige Matsubara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/523,925

(22) Filed: Mar. 9, 2000

(30) Foreign Application Priority Data

Mar. 11, 1999 (JP) .................................................. 11-065192

(51) Int. Cl.[7] .................................................. H03M 7/40
(52) U.S. Cl. .............................................. 341/106; 341/67
(58) Field of Search ............................... 341/67, 106, 65, 341/138, 139, 155; 382/246, 233, 245; 386/94, 111

(56) References Cited

U.S. PATENT DOCUMENTS

| | | | |
|---|---|---|---|
| 5,162,795 | * 11/1992 | Shirota | 341/67 |
| 5,550,541 | * 8/1996 | Todd | 341/51 |
| 5,933,536 | * 8/1999 | Fukuzawa | 382/246 |
| 6,226,445 | * 5/2001 | Abe | 386/94 |

FOREIGN PATENT DOCUMENTS 5-48905  2/1993  (JP) .

* cited by examiner

*Primary Examiner*—Peguy JeanPierre
*Assistant Examiner*—Joseph J Lauture

(57) ABSTRACT

In an inversely quantizing method of determining an inverse quantization value Y from an original quantization index value X, scale conversion is performed to a quantization index value X1 as at least a part of the original quantization index value X to produce first and second values which indicate the quantization index value X1. Then, first and second tables are referred to based on the first and second values, to determine third and fourth values corresponding to the first and second values, respectively. Then, an inverse quantization value Y is determined from the third and fourth values.

30 Claims, 7 Drawing Sheets

INVERSE QUANTIZATION USING TABLE WITH REDUCED SIZE

BACKGROUND OF THE INVENTION

1. Field of the Invention

The present invention relates to a method of inverse quantization for transmission of data with large change of a physical quantity and an inverse quantization apparatus for the same.

2. Description of the Related Art

Recently, it is requested that audio signal communication is carried out in high precision. For the purpose of the high precision, the digitization of an audio signal is carried out. In this case, it is necessary in a small volume region that the audio signal is quantized using a small volume difference. On the other hand, it is sufficient in a large volume region that the audio signal is quantized using a large volume difference. As shown in FIG. 1, the volume of the audio signal is quantized in a small volume region S1 based on the smallest unit of "1", and the quantization indexes X are illustrated as "1", "2" and "3". In a large volume region S2, the volume of the audio signal is quantized based on the larger unit of "100", and the quantization indexes X are illustrated as "1100", "1200" and "1300".

When the volume of the audio signal as continuous data is properly quantized, a quantization index X as a discrete value is obtained. The quantization index X is subject to a binary conversion for the digital communication. At this time, if the quantization index X is large, the number of bits of the binary value also becomes huge.

A method using a table is known as the technique for preventing the production of the binary value with a large number of bits. FIG. 2 shows such a method. In this method, a quantization index X is obtained through quantization of continuous data. An inverse quantization value Y corresponding to the quantization index X is retrieved from the table and is decoded. To improve precision of the reproduced sound, the scale of the table becomes enormous even in the method using such a table. As a result, a huge memory region is used for the table in one chip.

The technique for preventing the use of such a huge table is known in Japanese Laid Open Patent Application (JP-A-Heisei 5-48905). When a large value is handled, it is generally known to use a non-linear function in a logarithm scale calculator. Such conversion is also carried out in case of the audio communication. As one candidate for standardization of the non-linearizaion in the future, the following equation is proposed in the Japanese Laid Open Patent ApplicatiOn (JP-A-Heisei 5-48905).

$$Y = X^c$$

where X is a quantization index and Y is an inverse quantization value. A variable X is transmitted using the above function, and the value Y is determined from the received variable X. Even in this case, the size of a table necessary in the receiving side is equal to the width of the definition region of the quantization index X. Therefore, the table size has become very large. For example, the definition region of the quantization index X is from 0 to 8191 in MPEG1-layer3 decoder and MPEG2-AAC decoder. At this time, the size of table is 8192. In this way, there is a problem that the size of the inverse quantization table becomes very large in the above conventional examples.

SUMMARY OF THE INVENTION

Therefore, an object of the present invention is to provide a method of inverse quantization, in which a table size can be made small in the inverse quantization, and an inverse quantization apparatus for the same.

Another object of the present invention is to provide a method of inverse quantization, in which two tables with small sizes are used in the inverse quantization, and an inverse quantization apparatus for the same.

Still another object of the present invention is to provide a method of inverse quantization, in which a basic table for a quantization index in a predetermined region and a scaling table for a quantization index in a region larger than the predetermined region are used in the inverse quantization, and an inverse quantization apparatus for the same.

In order to achieve an aspect of the present invention, an inversely quantizing method of determining an inverse quantization value Y from an original quantization index value X, is attained by performing scale conversion to a quantization index value X1 as at least a part of the original quantization index value X to produce first and second values which indicate the quantization index value X1, by referring to first and second tables based on the first and second values, to determine third and fourth values corresponding to the first and second values, respectively, and determining an inverse quantization value Y from the third and fourth values.

Here, the method may further include determining whether the quantization index value X1 falls within a predetermined basic region. In this case, the performing includes performing the scale conversion to the quantization index value X1 using a parameter larger than 1, when it is determined that the quantization index value X1 does not fall within the predetermined basic region.

In this case, the scale conversion may be conversion of the quantization index value X1 to an exponential function value having the first value as a mantissa and the second value as an exponential part. Also, the performing may include dividing the quantization index value X1 with the parameter, to determine a rounded quotient, wherein the parameter is a first parameter value power of a second parameter value, the rounded quotient is the first value and the first parameter value is the second value and determined based on the quantization index value. In this case, it is desirable that the second parameter value is "2". Also, it is desirable that the first parameter value is variable based on the quantization index value X1.

Also, the method may further include determining whether the quantization index value X1 falls within a predetermined basic region, and setting the second value to "0" without performing the scale conversion, when the quantization index value X1 falls within the predetermined basic region.

Also, the referring is carried out without referring to the second table, to set the fourth value to "0" when the quantization index value X1 falls within the predetermined basic region.

Also, the referring may include referring to the first table based on the first value to retrieve fifth and sixth values, and carrying out interpolation using the fifth and sixth values and the first value to determine the third value.

Also, the method may further include determining whether the quantization index value X1 falls within a predetermined basic region. In this case, the performing may include performing the scale conversion to the quantization index X such that a value after the scale conversion falls within the basic region, when it is determined that the quantization index value X1 does not fall within the predetermined basic region, and producing the value after the scale conversion as the first value ana a value indicative of relation between the quantization index value X1 and the value after the scale conversion as the second value.

Also, the determining may include calculating a value of an exponential function using the third and fourth values. In this case, it is desirable that the exponential function value is c power of a production of the third value and the fourth value, and that c is a predetermined value. It is further desired that c =⅓.

Also, the method may further include dividing the original quantization index value X into an addition quantization index value X2 and the quantization index value X1. In this case, the determining may include calculating a value of an exponential function using the third and fourth values, and calculating a production of the addition quantization index value and the calculated exponential function value.

In order to achieve another aspect of the present invention, an inversely quantizing apparatus includes a first table outputting first value in response to a second value which is in a predetermined range, and a second table outputting a third value in response to a fourth value. Also, the apparatus includes a shift amount estimating circuit estimating a shift amount of a quantization index value and outputting the estimated shift amount as the fourth value to the second table. Also, the apparatus further includes a first shifting circuit shifting the quantization index value based on the estimated shift amount to produce an fifth value as an integer part and a sixth value as a fractional part, and a calculating circuit calculating an inverse quantization value from the first value and the third value.

In this case, the first table may output the first value and an additional value in response to the second value. In this case, the apparatus may further includes an interpolating circuit calculating an interpolated value from the first value, the additional value, the sixth value and the estimated shift amount, and an adder interposed between the first table and the calculating circuit, and calculating a seventh value from the first value and the interpolated value. The calculating circuit calculates the inverse quantization value from the seventh value and the third value, in place of the first value.

In order to achieve still another aspect of the present invention, a recording medium storing a program for an inversely quantizing method of determining an inverse quantization value Y from an original quantization index value X, the method including:

performing scale conversion to a quantization index value X1 as at least a part of the original quantization index value X to produce first and second values which indicate the quantization index value X1;

referring to first and second tables based on the first and second values, to determine third and fourth values corresponding to the first and second values, respectively; and determining an inverse quantization value Y from the third and fourth values.

DESCRIPTION OF THE PREFERRED EMBODIMENTS

Hereinafter, a non-linear inverse quantization apparatus of the present invention will be described below in detail with reference to the attached drawings.

Figure 3:
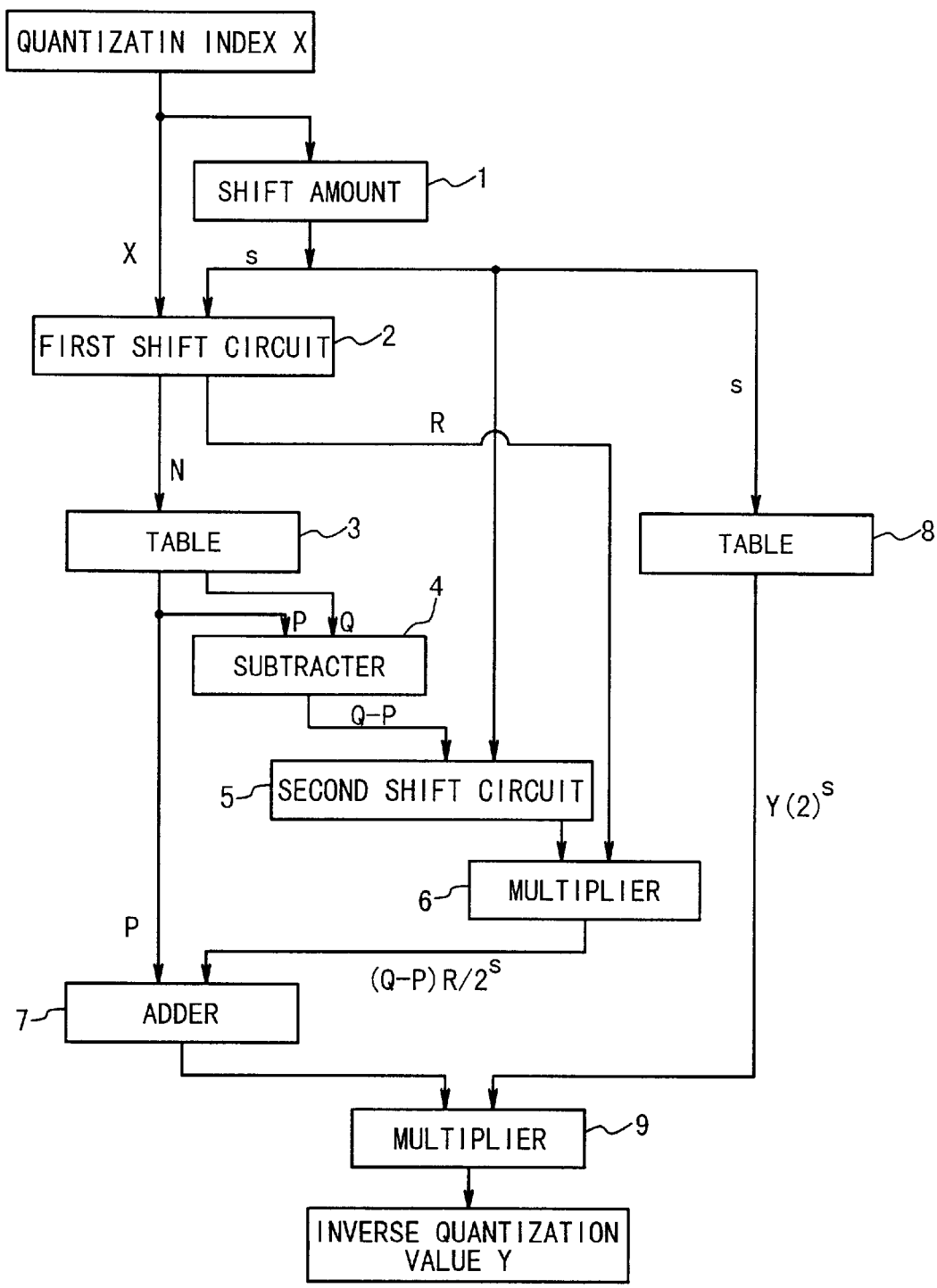
FIG. 3 is a circuit block diagram showing the structure of a non-linear inverse quantization apparatus according to a first embodiment of the present invention.

FIG. 3 shows the non-linear inverse quantization apparatus according to the first embodiment of the present invention. Referring to FIG. 3, the non-linear inverse quantization apparatus is composed of a shift amount detecting circuit 1, a first shift circuit 2, a first table 3, a multiplier 4, a second shift circuit 5, a multiplier 6, an adder 7, a second table 8, and a multiplier 9.

A non-linear function expressed by the following equation (1) is used in a decoding operation as the inverse quantization by the inverse quantization apparatus.

$$Y=F(X) \qquad (1)$$

Especially, this function is realized as the following equation (2) which is a candidate of a standard in future.

$$y=X^c \qquad (2)$$

where c is a constant, and ⅓ is proposed as the value of c.

A quantization index X can be expressed as follows.

$$X=N*2^s+R \qquad (3)$$

Here, a shift amount s is defined. The shift amount s is a constant used when the quantization value X as a variable is subjected to scale conversion. More specifically, the shift amount s is an exponential part of an exponential function which is proposed by the inventor of the present invention. An example in which the scale conversion is carried out using $2^s$ will be described.

It is supposed that the quantization index X is subjected to the scale conversion and a new variable X' is obtained from the above equation (3).

$$X'=X/2^s=N+R/2^s<xo \qquad (4)$$

where s is "0" or a positive integer. The $2^s$ is larger than 1 if s is not "0". The equation (1) is scale-converted as follows.

$$Y=F(X)=(2^{s}*X')^c=2^{sc}*(X/2^s)^c \qquad (5)$$

It is supposed that the size of the first table 3 is xo. That is, the first table 3 is used for the quantization index X in a basic definition region, i.e., in case of s=0. The definition region of the variable X' after the scale conversion is made equal to the definition region of 0 to xo for the first table 3. For this purpose, the shift amount detecting circuit 1 determines the exponential part s which satisfies the above equation (4).

That is, the variable X is subjected to the scale conversion using a suitable value s, so that the value X' after the scale conversion can be set to be equal to or less than xo. The exponential part s thus determined is supplied to the first shift circuit 2. The first shift circuit 2 shifts the variable X into a right direction by s bits. Thus, the first shift circuit 2 determines a quotient N and a remainder R from the following equation (6) using the exponential part s.

$$X'=X/2^s=N+R/2^s \quad 0 \leq R<2^s \quad (6)$$

That is, when the variable X is subjected to the scale conversion using the suitable exponential part s, the variable X' after the scale conversion can be set to be equal to or less than xo. Here, the value X is divided with $2^s$. In this case, there are a case that the remainder $R/2^s$ is "0", and a case that the remainder $R/2^s$ is not "0". The value X' after the scale conversion when the remainder $R/2^s$ is "0" corresponds to a value in a range of (xo/2) to xo in the first table 3.

At this time, the value N is determined through the calculation of the above equation (6) by the first shift circuit 2 and is supplied to the first table 3 of FIG. 3. It is supposed that the decoded value Z corresponding to the value X' after scale conversion is expressed as follows.

$$Z=Z_{int}+Z_{frac} \quad (7)$$

The decoded value $Z_{int}$ corresponding to the value N is determined as a table value P from the first table 3. Also, a value (N+1) is determined as a table value Q for the fractional part $R/2^s$ when the remainder $R/2^s$ is not "0" in the above case. The decoded value $Z_{frac}$ corresponding to the fractional part $R/2^s$ is determined by use of the interpolation between N and (N+1). That is, a table value Q corresponding to the next value (N+1) is determined from the first table 3. The table value P and the table value Q are supplied to the subtracter 4. The subtracter 4 calculates (Q–P).

The subtraction resultant value (Q–P) is supplied from the subtracter 4 to the second shift circuit 5. The second shift circuit 5 can calculate the following equation (8).

$$Z'=(Q-P)/2^s \quad (8)$$

That is, the second shift circuit 5 shifts the value (Q–P) in a right direction by s bits. The shifted value Z' is supplied from the second shift circuit 5 to the multiplier 6. Also, the fractional part R is supplied from the first shift circuit 2 to the multiplier 6.

$$Z_{frac}=Z'*R \quad (9)$$

The multiplier 6 determines the value $Z_{frac}$ corresponding to the fractional part $R/2^s$ through the calculation of the linear interpolation between the table value P and the table value Q from the above equation (9). The multiplier 6 supplies the value $Z_{frac}$ to the adder 7.

The adder 7 calculates the decoded value Z corresponding to the variable X' from the following equation (10).

$$Z=P+(Q-P)*R/2^s \quad (10)$$

In addition, the shift amount s which has been determined by the shift amount detecting circuit 1 is supplied to the second table 8. The second table 8 stores decoded values $Z_{exp}$ corresponding to the shift amount s, as shown by the following equation (11). The second table 8 is the function of the variable s. This value $Z_{exp}$ is shown as $Y(2^s)$ in the FIG. 3.

$$Z_{exp}=2^s \quad (11)$$

The calculation resultant value of the adder 7 and the decoded value $Z_{exp}$ determined from the second table 8 are supplied to the multiplier 9 to calculate the equation (5). The inverse quantization value Y is determined through the calculation of the above equation (5).

Figure 1:
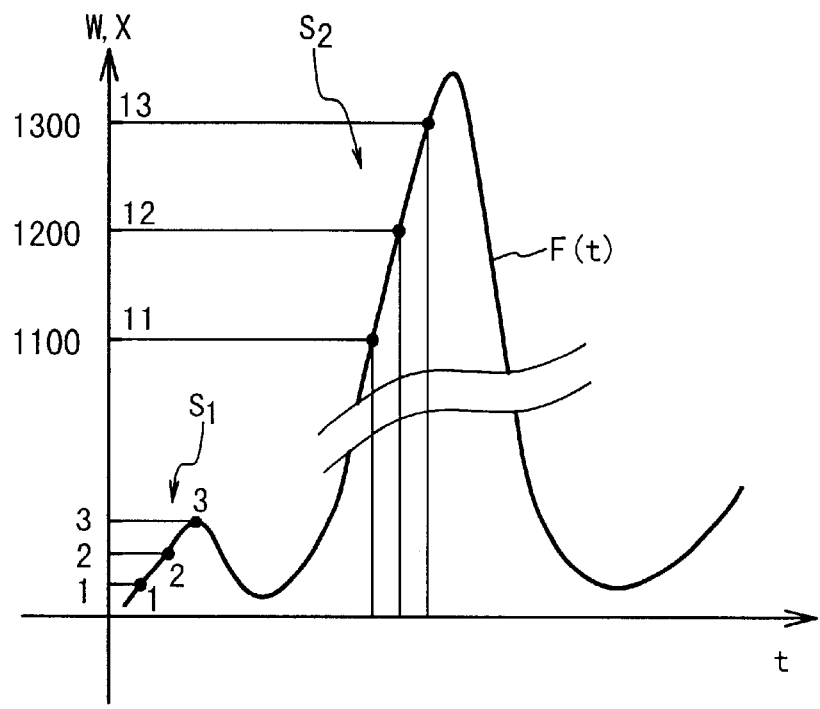
FIG. 1 is a graph showing a volume change of an audio signal.
Figure 2:
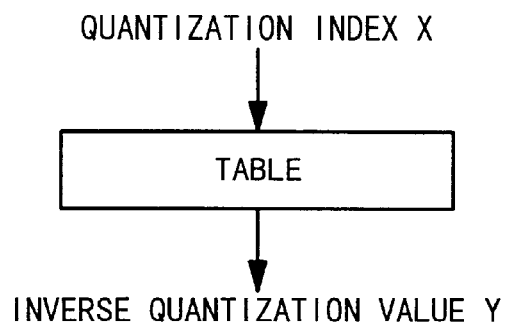
FIG. 2 is a circuit block diagram showing the structure of a conventional inverse quantization apparatus using an inverse quantization table.

In this embodiment, when $0 \leq X \leq xo$, the inverse quantization apparatus uses the first table 3 which is same as that of the conventional example of FIG. 2. This is because s=0. However, when xo<X, the inverse quantization apparatus uses the first table 3 and the second table 8. The second table 8 is the table for the shift amount s as a parameter. One value of s corresponds to the variable X in a range of about $xo*2^{s-1}$ to $xo*2^s$. That is, s=1 when the variable X is in the range of $xo*2^0$ to $xo*2^1$;

s=2 when the variable X is in the range of $xo*2^1$ to $xo*2^2$; and s=3 when the variable X is in the range of $xo*2^2$ to $xo*2^3$ Therefore, only one value is provided for every $2^s$ when the variable X is larger than xo. Thus, the second table 8 can be made small in size. The size of the table can be largely reduced, compared with the conventional table.

The inverse quantization apparatus will be described more specifically.

It is supposed that the quantization index X is a variable in the following range.

$$0 \leq X \leq 2^n \quad (12)$$

Figure 4:
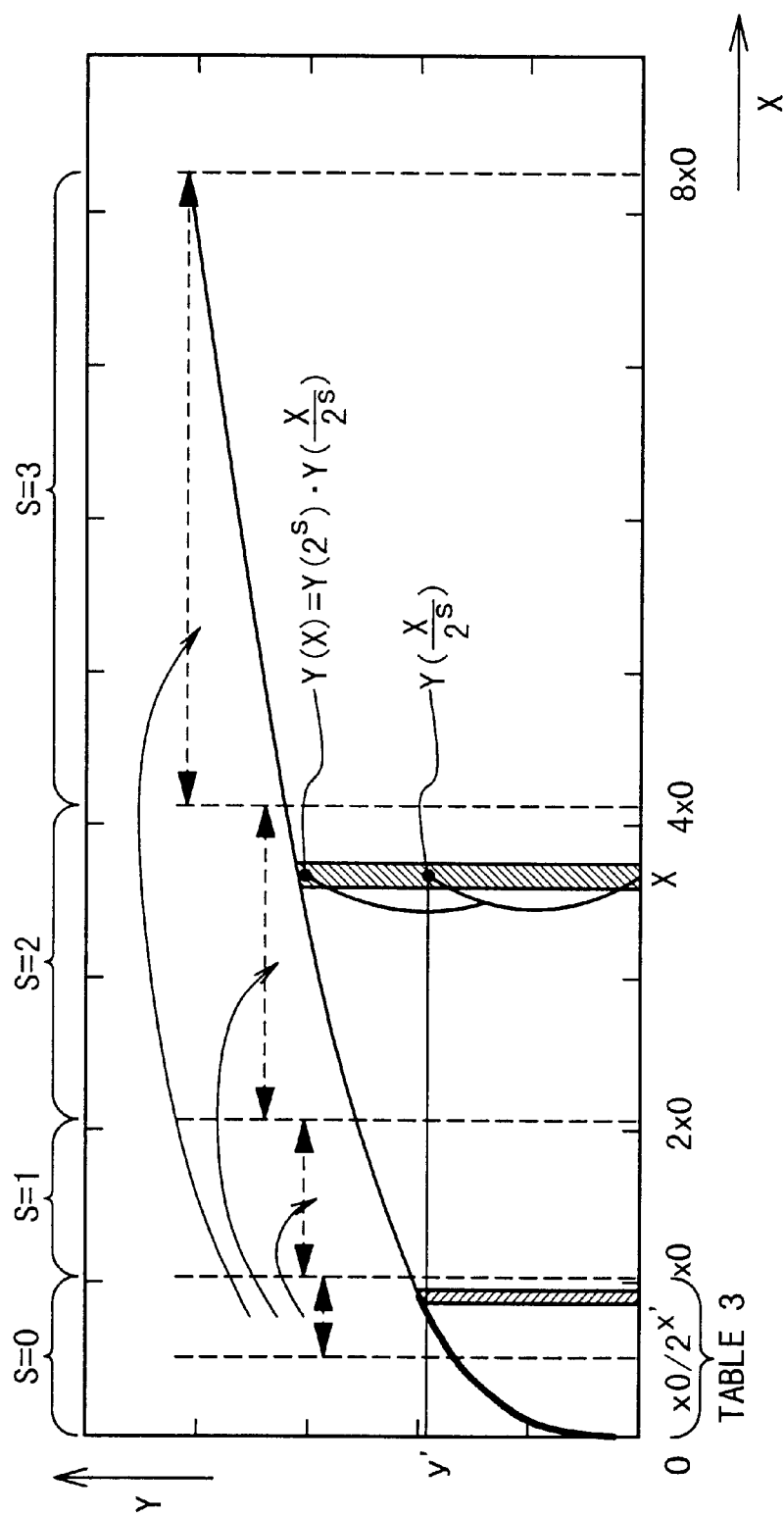
FIG. 4 is a graph showing a non-linear function in the first embodiment.

In this case, the size of the quantization index X is $2^n+1$. It is supposed that the size of the first table 3 is xo. The first shift circuit 2 calculates the shift value N and the fractional value R obtained by shifting the quantization index X by the shift amount s. This shifting operation corresponds to division the quantization index X by $2^s$. That is, the shifting operation means a variable conversion from the variable X before the scale conversion into the variable X' after the scale conversion. Such a shifting operation is shown in FIG. 4. For easy understanding, the function is shown as not the function of $X^{4/3}$ but the function of $X^{1/3}$ in FIG. 4. The first definition region of the variable x is equal to the basic definition region, i.e., $0 \leq X<xo$, and s=0. The second definition region of the variable X is $xo \leq X<2xo$ and s=1. The third definition region of the variable X is $2xo \leq X<4xo$ and s=2. The fourth definition region of the variable X is $4xo \leq x<8xo$ and s=3. In this way, the definition region extends or expands like an exponential function.

Figure 5:
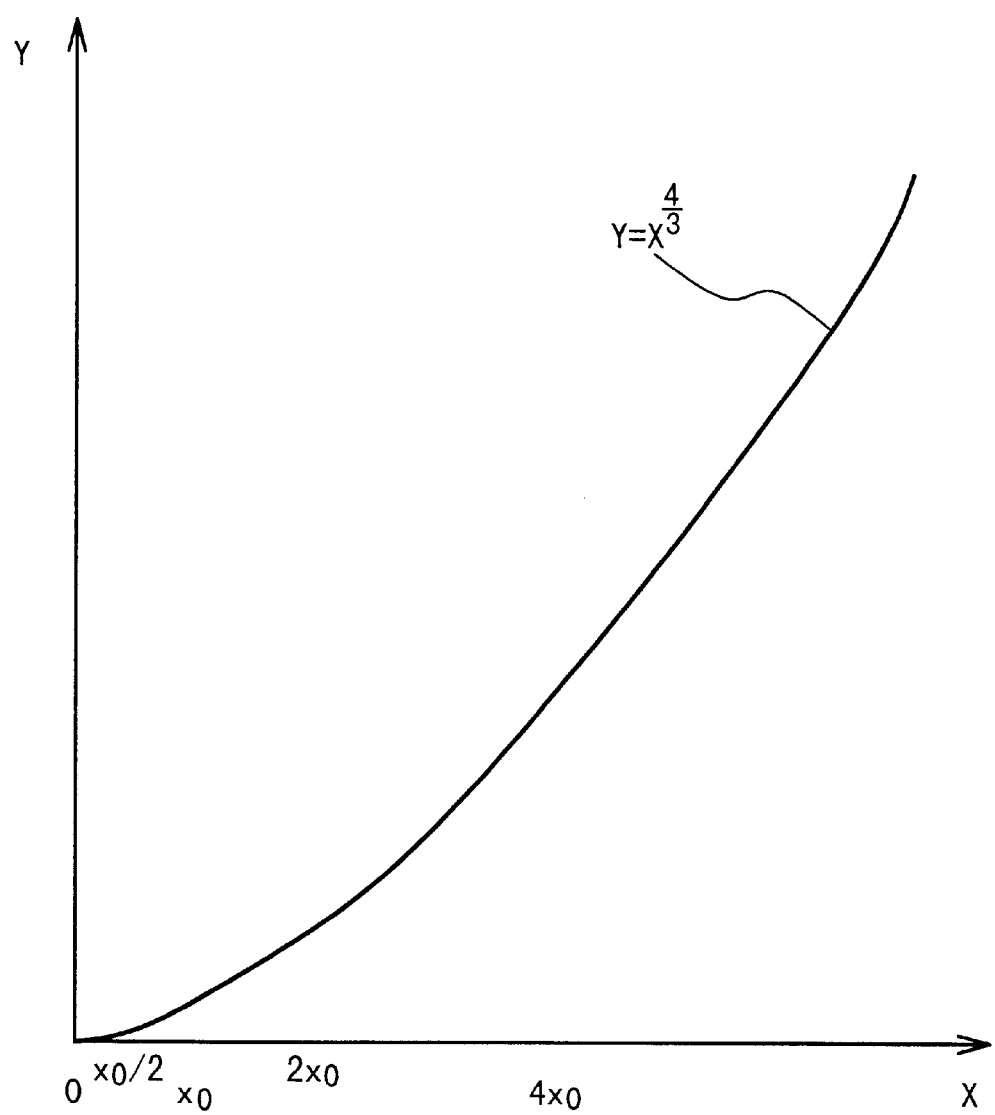
FIG. 5 is a graph showing a non-linear function after scale conversion.

The function of the equation (2), i.e., $Y=F(X)=X^{4/3}$ is shown in FIG. 5. In the conventional example, if the scale of the table is 256 in the range to xo, the size of the table increases to 512 in the range to 2xo, and 1024 in the range to 4xo. That is, the size of the table increases like an exponential function.

In FIG. 4, the first table 3 has the size of xo. In this example, the size of the first table 3 is 257 for the quantization index X in a range to 0 to 256. The value of xo can be determined based on the size of the table in case of design and the precision of the inverse quantization value Y needed in the inverse quantization. When the quantization index X is in a range of 0 to xo, the inverse quantization value Y is given from the first table 3. When the quantization index X is larger than xo, the shift amount s as an exponential part of the variable X' is determined in such a manner that the quantization index X Is divided by $2^s$ and the quotient is equal to or smaller than xo. In this method, a suitable value of s can be found for any quantization index X. Therefore, the quotient N falls within the range of xo/2 to xo. This is shown by the arrows in FIG. 4. FIG. 4 shows a case where the quantization index X is in a range of 2xo<X<4xo. Here, the Y coordinate value of the corresponding point is y' for the X in the range of xo/2 to xo. At this time, the value of s is "2". When division of the quantization index X by $2^2$ has a reminder, the shift amount s is determined by use of an interpolation between corresponding points N and N+1. The method will be described below with reference to FIG. 6.

Figure 6:
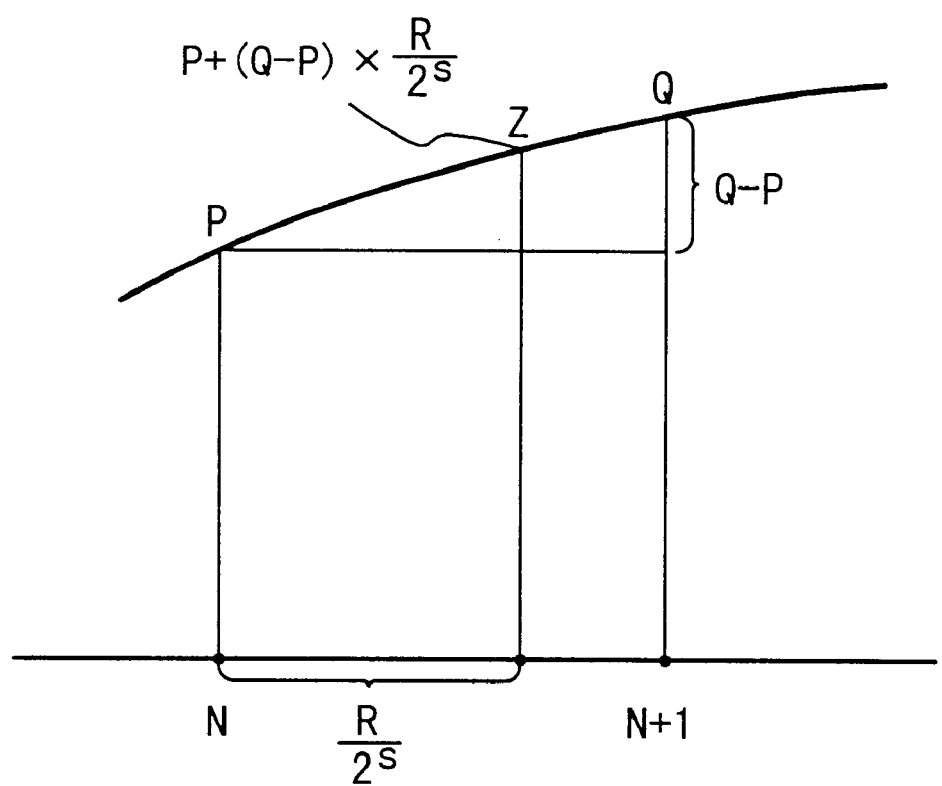
FIG. 6 is a graph showing linear interpolation in the first embodiment.

FIG. 6 shows the interpolation when the quotient of the division of the quantization index X by 4 (=$2^2$) is between N and (N+1). The table values corresponding to the quotient N and the quotient (N+1) are shown by P and Q, as described above. The value of Y is sufficiently linear between the values P and Q. A table value between the values P and Q is not given from the first table 3. The linear interpolation calculation is carried out between the value P and the value Q, and a desirable decoded value Z is determined through the linear interpolation calculation.

When the size of the first table 3 is $2^n+1$, the size S of the second table 8 of the present invention is shown by the following equation (13).

$$S=[\log_2(\text{definition region of quantization index X})2^n] \quad (13)$$

It is supposed that n=8 and the definition region of the quantization index X is a range 0 to 8191 (=$2^{13}-1$). In this case, the size of the first table 3 is 257 (=$2^8+1$) and the size of the second table 8 is 5.

In a case, the inverse quantization is carried out only by referring to the tables. Also, in another case, the inverse quantization is carried out by referring to the tables and by carrying out the linear interpolation. Thus, the inverse quantization value Y can be determined.

$2^s$ is shown as an example in the previously mentioned reduction percentage of the coordinates through the scale conversion. However, the reduction percentage can be optionally adopted. For example, in place of $2^s$, the unit larger than "1" such as s power of 3 ($3^s$), a fractional number power of 2 (the fraction number is larger than "1"), and a first fractional number of a second fractional number power (the first and second fractional numbers are larger than "1") can be adopted. Without merely dividing of the quantization index X, the reduction percentage may be given as the function of the quantization index X.

When an exponential function is adopted as $X^c$, the value c of ⅓ is selected in the previously mentioned embodiment. However, this value c of ⅓ is the value corresponding to the world standard which is temporarily agreed at present. The value may be changed in future. In the previously mentioned embodiment, the object to be controlled is the volume of sound or the amplitude of an audio signal. However, the object to be controlled is not limited to the sound volume. The present invention can effectively apply to data corresponding to a function F(t) of time, in which the function value changes rapidly and largely. There are a physical quantity and a mathematical quantity such as a light value, a voltage value, and a current value in addition to the sound volume as such data.

When c is limited to ⅓, in the previously mentioned embodiment, the following equation (14) is calculated in the multiplier 9.

$$Y=X^{4/3} \quad (14)$$

However, the following calculations (15) and (16) are possible.

$$Y=X*X^{1/3} \quad (15)$$

$$Y=(X^{2/3})^2 \quad (16)$$

Figure 7:
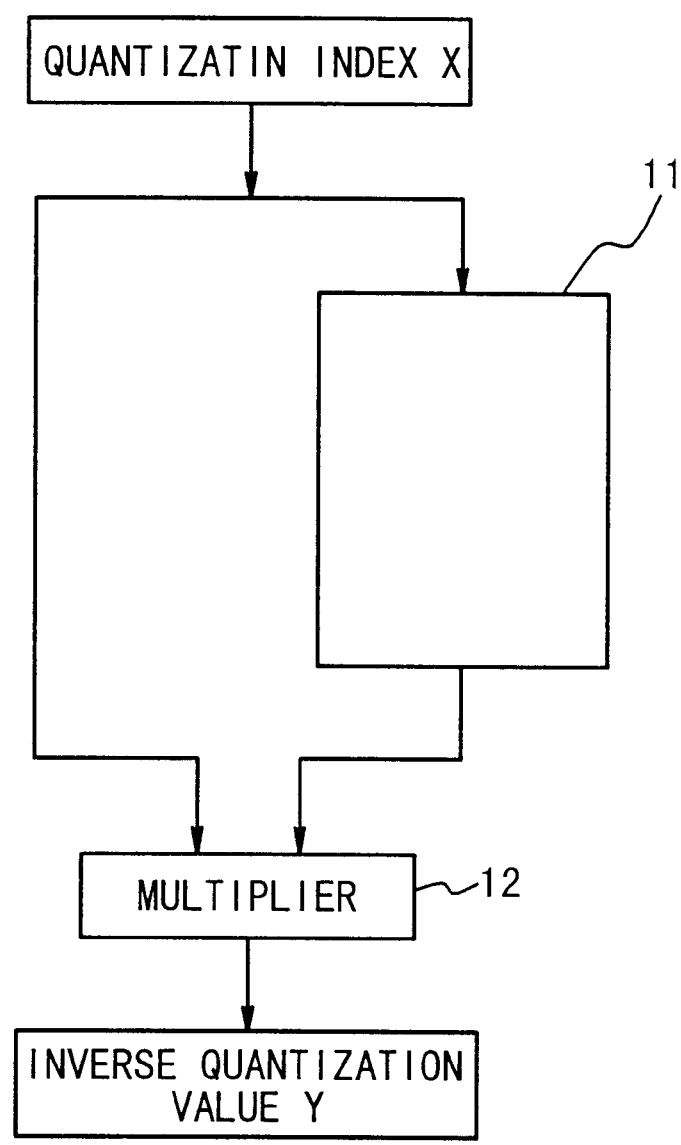
FIG. 7 is a circuit block diagram showing the non-linear inverse quantization apparatus according to a second embodiment of the present invention.

FIG. 7 shows the inverse quantization apparatus for calculating the above equation (15). The quantization index X is supplied to a converting circuit 11, and the converting circuit 11 calculates $X^{1/3}$. The calculating result of $X^{1/3}$ and the quantization index X are supplied to a multiplier 12 and the inverse quantization value Y is calculated by the multiplier 12 from the equation (15). In this case, the inverse quantization apparatus shown in FIG. 3 can be used for the converting circuit 11.

Figure 8:
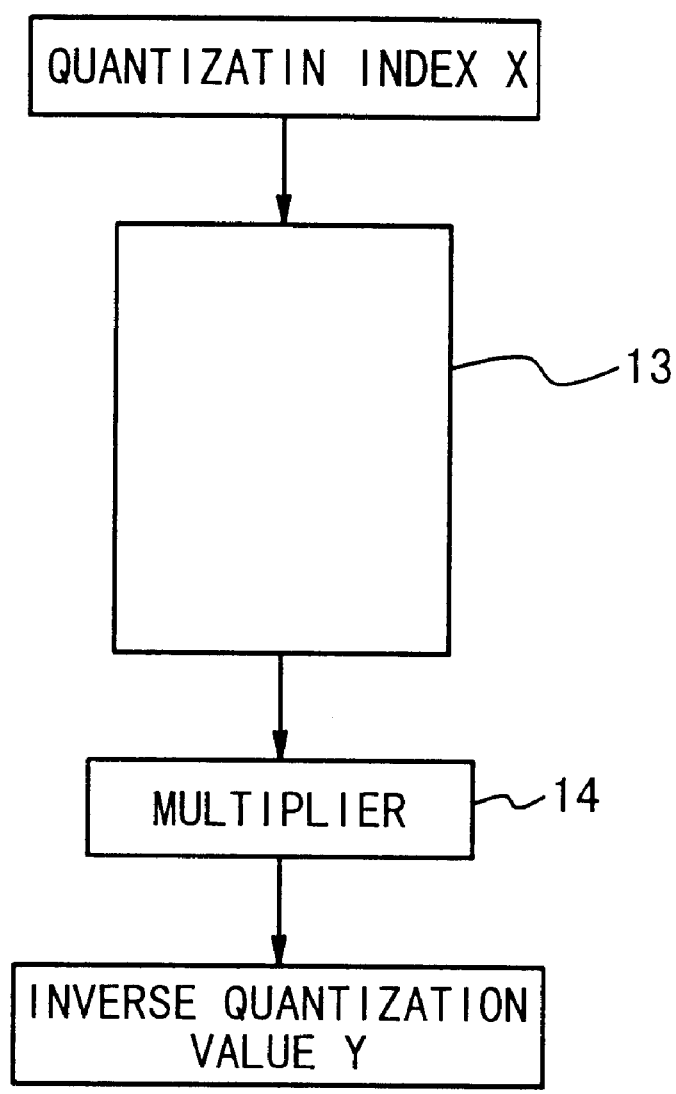
FIG. 8 is a circuit block diagram showing the non-linear inverse quantization apparatus according to a third embodiment of the present invention.

FIG. 8 shows the inverse quantization apparatus for calculating the above equation (16). The quantization index X is supplied to a converting circuit 13. The converting circuit 13 calculates $X^{2/3}$. The calculating result $X^{2/3}$ is supplied to a multiplier 14 for square calculation and the inverse quantization value Y is calculated by the multiplier 14. In this case, the inverse quantization apparatus shown in FIG. 3 can be used for the converting circuit 11.

In the previously mentioned embodiments, a proper exponential function is used in case of using a binary value. However, when a ternary value is used, the scale conversion of $3^s$ is used. In this case, it is proper to use the equation (16). Generally, the function properly adopted in accordance with a physical quantity and/or a mathematical quantity of the communication control object can be used for the scale conversion.

Also, in the previously mentioned embodiments, when the quantization index falls within a basic definition region of $0 \leq X < xo$, estimation of the shift amount by the shift amount detecting circuit 1 can be omitted, and s is set to "0". Also, the referring operation to the second table 8 and a part of the calculation by the multiplier 9 can be omitted.

Also, when the interpolation may be omitted, the subtracter 4, the second shift circuit 5, the multiplier and the adder 7 may be omitted.

The non-linear inverse quantization apparatus of the present invention can carry out the inverse quantization using the table with a small scale. Thereby, the hardware memory can be made small.

Also, the table size can be made small in the state in which precision of such a scale conversion is kept.

What is claimed is:

1. An inversely quantizing method of determining an inverse quantization value Y from an original quantization index value X, comprising:

performing scale conversion to a quantization index value X1 as at least a part of said original quantization index value X to produce first and second values which indicate said quantization index value X1;

referring to first and second tables based on said first and second values, to determine third and fourth values corresponding to said first and second values, respectively; and determining an inverse quantization value Y from said third and fourth values.

2. An inversely quantizing method according to claim 1, further comprising:

determining whether said quantization index value X1 falls within a predetermined basic region, and wherein said performing includes:

performing said scale conversion to said quantization index value X1 using a parameter larger than 1, when it is determined that said quantization index value X1 does not fall within said predetermined basic region.

3. An inversely quantizing method according to claim 1, further comprising:

determining whether said quantization index value X1 falls within a predetermined basic region; and setting said second value to "0" without performing said scale conversion, when said quantization index value X1 falls within said predetermined basic region.

4. An inversely quantizing method according to claim 1, wherein said referring is carried out without referring to said second table, to set said fourth value to "0" when said quantization index value X1 falls within said predetermined basic region.

5. An inversely quantizing method according to claim 2, wherein said scale conversion is conversion of said quantization index value X1 to an exponential function value having said first value as a mantissa and said second value as an exponential part.

6. An inversely quantizing method according to claim 2, wherein said performing includes:

dividing said quantization index value X1 with said parameter, to determine a rounded quotient, wherein said parameter Is a first parameter value power of a second parameter value, said rounded quotient is said first value and said first parameter value is said second value and determined based on said quantization index value.

7. An inversely quantizing method according to claim 6, wherein said second parameter value is "2".

8. An inversely quantizing method according to claim 6, wherein said first parameter value is variable based on said quantization index value X1.

9. An inversely quantizing method according to claim 1, wherein said referring includes:

referring to said first table based on said first value to retrieve fifth and sixth values; and carrying out interpolation using said fifth and sixth values and said first value to determine said third value.

10. An inversely quantizing method according to claim 1, further comprising:

determining whether said quantization index value X1 falls within a predetermined basic region, and wherein said performing includes:

performing said scale conversion to said quantization index X such that a value after said scale conversion falls within said basic region, when it is determined that said quantization index value X1 does not fall within said predetermined basic region; and producing said value after said scale conversion as said first value and a value indicative of relation between said quantization index value X1 and said value after said scale conversion as said second value.

11. An inversely quantizing method according to claim 1, wherein said determining includes:

calculating a value of an exponential function using said third and fourth values.

12. An inversely quantizing method according to claim 11, wherein said exponential function value is c power of a production of said third value and said fourth value, c being a predetermined value.

13. An inversely quantizing method according to claim 12, wherein $c=\frac{4}{3}$.

14. An inversely quantizing method according to claim 1, further comprising:

dividing said original quantization Index value X into an addition quantization index value X2 and said quantization index value X1, and said determining includes:

calculating a value of an exponential function using said third and fourth values; and calculating a production of said addition quantization index value and said calculated exponential function value.

15. An inversely quantizing apparatus comprising:

a first table outputting first value in response to a second value which is in a predetermined range;

a second table outputting a third value in response to a fourth value;

a shift amount estimating circuit estimating a shift amount of a quantization index value and outputting said estimated shift amount as said fourth value to said second table;

a first shifting circuit shifting said quantization index value based on said estimated shift amount to produce an fifth value as an integer part and a sixth value as a fractional part; and a calculating circuit calculating an inverse quantization value from said first value and said third value.

16. An inversely quantizing apparatus according to claim 15, wherein said first table outputting said first value and an additional value in response to said second value, and wherein said inversely quantizing apparatus further comprises:

an interpolating circuit calculating an interpolated value from said first value, said additional value, said sixth value and said estimated shift amount, and an adder interposed between said first table and said calculating circuit, and calculating a seventh value from said first value and said interpolated value, and wherein said calculating circuit calculates said inverse quantization value from said seventh value and said third value, in place of said first value.

17. A recording medium storing a program for an inversely quantizing method of determining an inverse quantization value Y from an original quantization index value X, wherein said method comprises:

performing scale conversion to a quantization index value X1 as at least a part of said original quantization index value X to produce first and second values which indicate said quantization index value X1;

referring to first and second tables based on said first and second values, to determine third and fourth values corresponding to said first and second values, respectively; and determining an inverse quantization value Y from said third and fourth values.

18. A recording medium according to claim 17, further comprising:

determining whether said quantization index value X1 falls within a predetermined basic region, and wherein said performing includes:

performing said scale conversion to said quantization index value X1 using a parameter larger than 1, when it is determined that said quantization index value X1 does not fall within said predetermined basic region.

19. A recording medium according to claim 17, wherein said method further comprises:

determining whether said quantization index value X1 falls within a predetermined basic region; and setting said second value to "0" without performing said scale conversion, when said quantization index value X1 falls within said predetermined basic region.

20. A recording medium according to claim 17, wherein said referring is carried out without referring to said second table, to set said fourth value to "0" when said quantization index value X1 falls within said predetermined basic region.

21. A recording medium according to claim 18, wherein said scale conversion is conversion of said quantization index value X1 to an exponential function value having said first value as a mantissa and said second value as an exponential part.

22. A recording medium according to claim 18, wherein said performing includes:
   dividing said quantization index value X1 with said parameter, to determine a rounded quotient, wherein said parameter is a first parameter value power of a second parameter value, said rounded quotient is said first value and said first parameter value is said second value and determined based on said quantization index value.

23. A recording medium according to claim 22 wherein said second parameter value is "2".

24. A recording medium according to claim 22, wherein said first parameter value is variable based on said quantization index value X1.

25. A recording medium according to claim 17, wherein said referring includes:
   referring to said first table based on said first value to retrieve fifth and sixth values; and
   carrying out interpolation using said fifth and sixth values and said first value to determine said third value.

26. A recording medium according to claim 17, wherein said method further comprises:
   determining whether said quantization index value X1 falls within a predetermined basic region, and
   wherein said performing includes:
      performing said scale conversion to said quantization index X such that a value after said scale conversion falls within said basic region, when it is determined that said quantization index value X1 does not fall within said predetermined basic region; and
   producing said value after said scale conversion as said first value and a value indicative of relation between said quantization index value X1 and said value after said scale conversion as said second value.

27. A recording medium according to claim 17, wherein said determining includes:
   calculating a value of an exponential function using said third and fourth values.

28. A recording medium according to claim 27, wherein said exponential function value is c power of a production of said third value and said fourth value, c being a predetermined value.

29. A recording medium according to claim 28, wherein $c=4/3$.

30. A recording medium according to claim 17, further comprising:
   dividing said original quantization index value X into an addition quantization index value X2 and said quantization index value X1, and
   said determining includes:
      calculating a value of an exponential function using said third and fourth values; and
      calculating a production of said addition quantization index value and said calculated exponential function value.

* * * * *